United States Patent
Hae-Yeon et al.

(10) Patent No.: US 8,659,512 B2
(45) Date of Patent: Feb. 25, 2014

(54) ORGANIC LIGHT EMITTING DIODE DISPLAY AND METHOD FOR MANUFACTURING THE SAME

(75) Inventors: Lee Hae-Yeon, Bucheon-si (KR); Young-In Hwang, Yongin-si (KR); Baek-Woon Lee, Yongin-si (KR)

(73) Assignee: Samsung Display Co., Ltd. (KR)

( * ) Notice: Subject to any disclaimer, the term of this patent is extended or adjusted under 35 U.S.C. 154(b) by 562 days.

(21) Appl. No.: 12/407,742

(22) Filed: May 20, 2009

(65) Prior Publication Data

US 2010/0066651 A1    Mar. 18, 2010

(30) Foreign Application Priority Data

Sep. 11, 2008  (KR) ................ 10-2008-0089823

(51) Int. Cl.
| | |
|---|---|
| *G09G 3/30* | (2006.01) |
| *H01J 1/62* | (2006.01) |
| *H01J 63/04* | (2006.01) |
| *H01L 27/14* | (2006.01) |
| *H01L 29/04* | (2006.01) |
| *H01L 29/15* | (2006.01) |
| *H01L 31/036* | (2006.01) |
| *H01L 29/20* | (2006.01) |
| *H01L 33/00* | (2010.01) |

(52) U.S. Cl.
USPC ............... 345/76; 313/503; 313/504; 257/72; 257/89

(58) Field of Classification Search
USPC .............. 345/694, 87, 55; 313/506, 503–504, 313/110, 499, 505; 257/40, 79, 291, 72, 89; 428/690; 359/280; 369/275.1, 100; 349/114, 106; 438/99, 149, 479; 315/73

See application file for complete search history.

(56) References Cited

U.S. PATENT DOCUMENTS

| | | | |
|---|---|---|---|
| 6,850,003 B1* | 2/2005 | Pichler et al. ................ 313/506 |
| 6,861,800 B2 | 3/2005 | Tyan et al. | |
| 7,057,339 B2 | 6/2006 | Boroson et al. | |
| 2004/0251824 A1* | 12/2004 | Chen et al. ..................... 313/506 |
| 2005/0062057 A1* | 3/2005 | Yamazaki et al. ............... 257/98 |
| 2005/0186717 A1* | 8/2005 | Gyoda et al. .................. 438/149 |
| 2005/0264183 A1* | 12/2005 | Seo et al. ....................... 313/504 |
| 2006/0097264 A1* | 5/2006 | Kim et al. ......................... 257/72 |
| 2006/0238119 A1* | 10/2006 | Spindler ....................... 313/506 |
| 2007/0102737 A1* | 5/2007 | Kashiwabara et al. ....... 257/291 |
| 2007/0262936 A1* | 11/2007 | Chang et al. .................... 345/87 |

(Continued)

FOREIGN PATENT DOCUMENTS

| | | |
|---|---|---|
| JP | 2005-129510 | 5/2005 |
| KR | 10-0542996 | 1/2006 |

(Continued)

*Primary Examiner* — Yong H. Sim
*Assistant Examiner* — Lin Li
(74) *Attorney, Agent, or Firm* — Innovation Counsel LLP

(57) ABSTRACT

The present invention relates to an organic light emitting device and a manufacturing method thereof. The organic light emitting device according to an embodiment of the present invention comprises: a first pixel displaying a first color; a second pixel displaying a second color; and a third pixel displaying a third color; wherein each of the first, second, and third pixels comprise a first translucent member, a second translucent member disposed on the first translucent member, an intermediate member disposed between the first and second translucent members, and a pixel electrode disposed on the second translucent member.

25 Claims, 12 Drawing Sheets

(56) References Cited

U.S. PATENT DOCUMENTS

| | | | |
|---|---|---|---|
| 2008/0042139 A1* | 2/2008 | Huh et al. | 257/72 |
| 2008/0203908 A1* | 8/2008 | Hasegawa et al. | 313/504 |
| 2008/0238295 A1* | 10/2008 | Takei et al. | 313/499 |
| 2009/0072709 A1* | 3/2009 | Kobayashi | 313/503 |
| 2009/0108743 A1* | 4/2009 | Kobayashi | 313/504 |
| 2009/0256470 A1* | 10/2009 | Naono | 313/504 |
| 2010/0252841 A1* | 10/2010 | Cok et al. | 257/89 |

FOREIGN PATENT DOCUMENTS

| | | |
|---|---|---|
| KR | 10-2006-0095494 | 8/2006 |
| KR | 10-0715500 | 4/2007 |
| KR | 10-2008-0024483 | 3/2008 |

* cited by examiner

FIG. 2

| G | B | R | G | B |
|---|---|---|---|---|
| B | R | G | B | R |
| R | G | B | R | G |
| G | B | R | G | B |
| B | R | G | B | R |

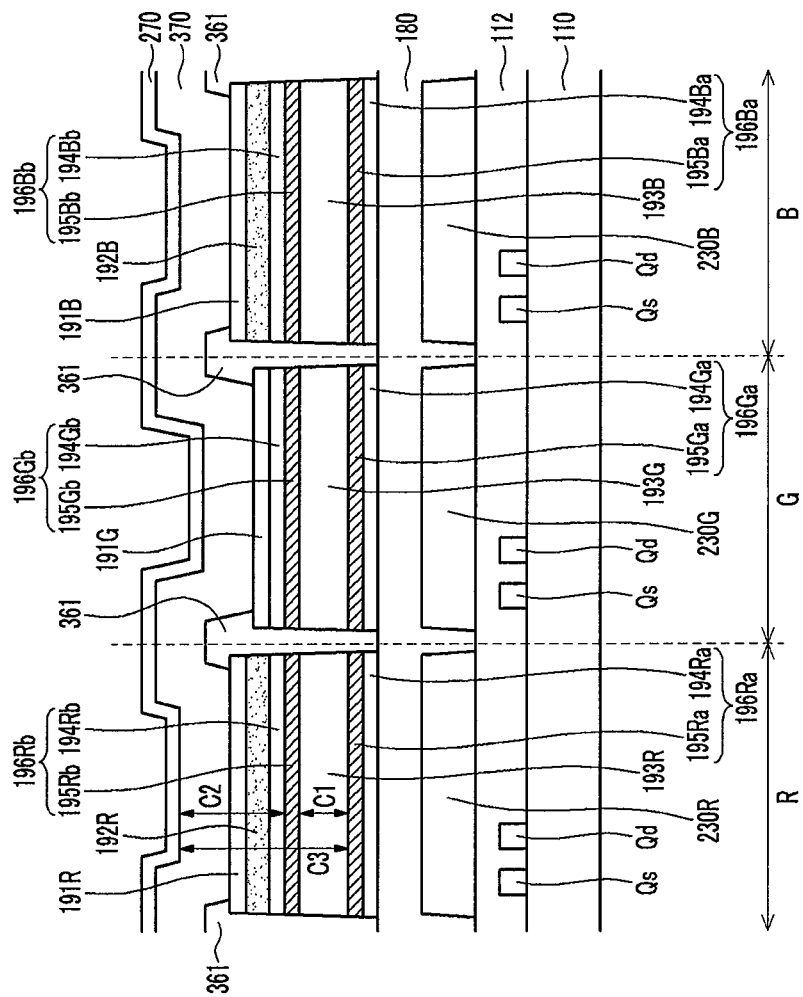

ORGANIC LIGHT EMITTING DIODE DISPLAY AND METHOD FOR MANUFACTURING THE SAME

CROSS-REFERENCE TO RELATED APPLICATION

This application claims priority to and the benefit of Korean Patent Application No. 10-2008-0089823 filed in the Korean Intellectual Property Office on Sep. 11, 2008, the entire contents of which are incorporated herein by reference.

BACKGROUND OF THE INVENTION (a) Field of the Invention

The present invention relates to an organic light emitting device and a manufacturing method thereof.

(b) Description of the Related Art

An organic light emitting device is a self-emissive display device, and an additional light source is not necessary such that the organic light emitting device has lower power consumption, as well as a high response speed, wide viewing angle, and high contrast ratio.

The organic light emitting device includes a plurality of pixels such as red pixels, blue pixels, and green pixels, and images of full color may be displayed by selectively combining these pixels.

Each pixel of the organic light emitting device includes an organic light emitting element and a plurality of thin film transistors for driving the light emitting element.

The organic light emitting element includes an anode, a cathode, and an organic light emitting member therebetween, and the organic light emitting member emits three primary colors of red, green, and blue, or a white color. Materials used vary according to the colors that the organic light emitting member emits, and a method of emitting white light may be used in which light emitting materials that emit red, green, and blue are stacked so that the synthesized light becomes white. Moreover, in the case where the organic light emitting member emits white light, color filters are added to obtain light of a desired color.

However, light having passed through the color filters represents color purity that is equal to or less than that of the corresponding color filters due to limitation in color reproducibility of the color filters.

The above information disclosed in this Background section is only for enhancement of understanding of the background of the invention and therefore it may contain information that does not form the prior art that is already known in this country to a person of ordinary skill in the art.

SUMMARY OF THE INVENTION

An organic light emitting device according to an embodiment of the present invention comprises: a first pixel displaying a first color; a second pixel displaying a second color; and a third pixel displaying a third color, wherein each of the first, second, and third pixels comprises a first translucent member, a second translucent member disposed on the first translucent member, an intermediate member disposed between the first and second translucent members, and a pixel electrode disposed on the second translucent member.

The first pixel may further comprise a first transparent member between the first translucent member and the second translucent member, or between the second translucent member and the pixel electrode.

The first transparent member may comprise at least one of indium tin oxide (ITO), indium zinc oxide (IZO), silicon oxide, and silicon nitride.

The second pixel may further comprise a second transparent member between the first translucent member and the second translucent member, or between the second translucent member and the pixel electrode, the third pixel may further comprise a third transparent member between the first translucent member and the second translucent member, or between the second translucent member and the pixel electrode, and a thickness of the second transparent member may be substantially the same as a thickness of the third transparent member.

The second pixel may be a red pixel, and the third pixel may be a blue pixel.

The second and third transparent members may comprise at least one of ITO, IZO, silicon oxide, and silicon nitride.

The organic light emitting device may further comprise an overcoat disposed under the first translucent members of the first, second, and third pixels.

At least one of the first, second, and third pixels comprises protrusions and depressions formed on a surface of the overcoat.

At least one of the first translucent member and the second translucent member may comprise a translucent metal member comprising silver or aluminum.

A thickness of the translucent metal member may be in a range of 50 to 200 Å.

At least one of the first translucent member and the second translucent member may further comprise an oxide conductive member disposed on or under the translucent metal member.

The oxide conductive member may comprise ITO or IZO. The intermediate member may comprise ITO or IZO.

At least one of the first translucent member and the second translucent member may comprise a first thin film and a second thin film.

The first thin film may comprise silicon oxide, and the second thin film may comprise silicon nitride.

The first thin film may comprise ITO or IZO, and the second thin film may comprise silicon oxide or silicon nitride.

The organic light emitting device may further comprise a common electrode disposed on the pixel electrode, wherein the first, second, and third pixels may further respectively comprise first, second, and third organic light emitting members disposed between the respective pixel electrodes and the common electrode.

The first, second, and third organic light emitting members may be white organic light emitting members and may be connected to each other.

The first, second, and third pixels may further respectively comprise a first color filter, a second color filter, and a third color filter disposed under the respective first translucent members.

The first, second, and third organic light emitting members may respectively represent different colors from each other.

The first, second, and third pixels may respectively comprise a first color filter, a second color filter, and a third color filter disposed under the respective first translucent members.

The first translucent member may comprise a reflective metal member comprising Al, Ag, Au, Pt, Ni, Cu, W, or alloys thereof.

The first, second, and third pixels may further respectively comprise first, second, and third color filters disposed on the respective pixel electrodes.

An organic light emitting device according to another embodiment of the present invention comprises: a substrate;

a first translucent member disposed on the substrate; an intermediate member disposed on the first translucent member; a second translucent member disposed on the intermediate member; a pixel electrode disposed on the second translucent member; an organic light emitting member disposed on the pixel electrode; and a common electrode disposed on the organic light emitting member.

A manufacturing method of an organic light emitting device comprising a first pixel displaying a first color, a second pixel displaying a second color, and a third pixel displaying a third color according to an embodiment of the present invention comprises: sequentially depositing a lower oxide conductive member layer, a lower translucent metal member layer, an intermediate member layer, an upper translucent metal member layer, and an upper oxide conductive member layer on a substrate; forming a transparent member on the upper oxide conductive member layer corresponding to at least one of the first pixel, the second pixel, and the third pixel; depositing a pixel electrode material on the transparent member and the upper oxide conductive member layer; forming a pixel electrode, an upper translucent member, an intermediate member, and a lower translucent member by patterning the pixel electrode material, the upper oxide conductive member layer, the upper translucent metal member layer, the intermediate member layer, the lower translucent metal member layer, and the lower oxide conductive member layer by photolithography; forming an organic light emitting member on the pixel electrode; and forming a common electrode on the organic light emitting member.

The formation of the transparent member may comprise: forming a first photosensitive pattern on the upper oxide conductive member layer corresponding to at least one pixel of the first pixel, the second pixel, and the third pixel; depositing a transparent member layer on the first photosensitive pattern and the upper oxide conductive member layer; forming a second photosensitive pattern on the transparent member layer corresponding to at least one the pixel where the first photosensitive pattern is not disposed among the first pixel, the second pixel, and the third pixel; etching the transparent member layer using the second photosensitive pattern as an etching mask; and removing the first and second photosensitive patterns.

The forming of the pixel electrode, the upper translucent member, the intermediate member, and the lower translucent member may comprise using an etching mask.

The first photosensitive pattern may comprise a photosensitive film disposed on the second and third pixels, and the second photosensitive pattern may comprise a photosensitive film disposed on the first pixel.

The lower and upper translucent metal member layer may comprise silver or aluminum.

The lower and upper oxide conductive member layer may comprise ITO or IZO.

BRIEF DESCRIPTION OF THE DRAWINGS

FIG. 2 is a top plan view showing an arrangement of a plurality of pixels in an organic light emitting device according to an embodiment of the present invention.

FIG. 4 to FIG. 6 are cross-sectional views of an organic light emitting device according to embodiments of the present invention, respectively.

DETAILED DESCRIPTION OF THE EMBODIMENTS

Figure 1:
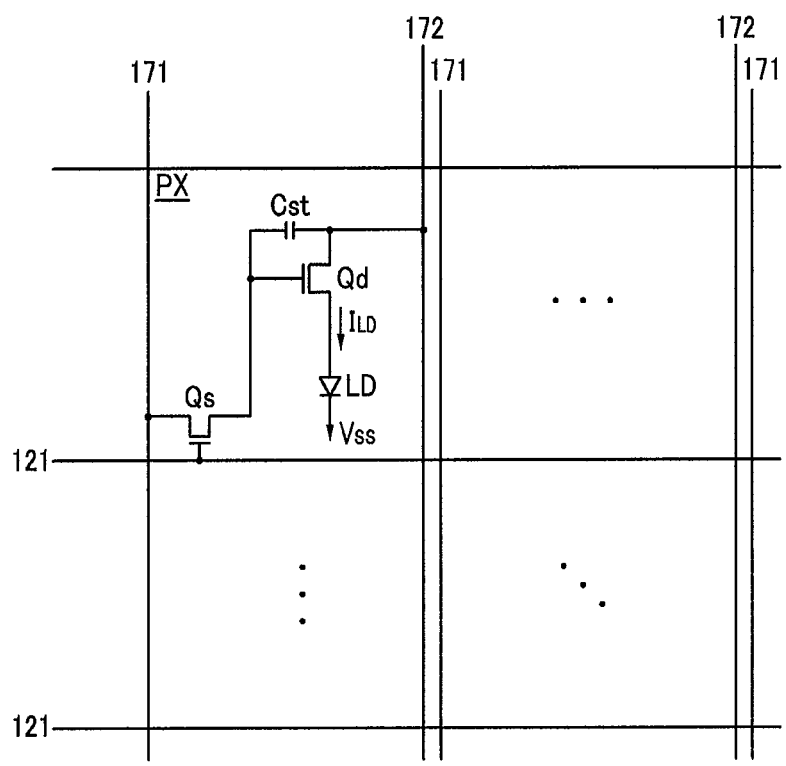
FIG. 1 is an equivalent circuit diagram of an organic light emitting device according to an embodiment of the present invention.

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

First, an organic light emitting device according to an embodiment of the present invention will be described with reference to FIG. 1.

FIG. 1 is an equivalent circuit diagram of an organic light emitting device according to an embodiment of the present invention.

Referring to FIG. 1, an organic light emitting device according to the present embodiment includes a plurality of signal lines 121, 171, and 172, and a plurality of pixels PX connected thereto and arranged substantially in a matrix.

The signal lines include a plurality of gate lines 121 for transmitting gate signals (or scanning signals), a plurality of data lines 171 for transmitting data signals, and a plurality of driving voltage lines 172 for transmitting a driving voltage. The gate lines 121 extend substantially in a row direction and may be substantially parallel to each other, and the data lines 171 extend substantially in a column direction and may be substantially parallel to each other. The driving voltage lines 172 extend substantially in a column direction, but they may extend in a row direction or may have a mesh shape.

Each pixel PX includes a switching transistor Qs, a driving transistor Qd, a capacitor Cst, and an organic light emitting diode (OLED) LD.

The switching transistor Qs has a control terminal connected to one of the gate lines 121, an input terminal connected to one of the data lines 171, and an output terminal connected to the driving transistor Qd. The switching transistor Qs transmits a data signal applied from the data line 171 to the driving transistor Qd in response to a gate signal applied to the gate line 121.

The driving transistor Qd has a control terminal connected to the switching transistor Qs, an input terminal connected to the driving voltage line 172, and an output terminal connected to the organic light emitting element LD. The driving transistor Qd drives an output current ILD having a magnitude depending on a voltage between the control terminal and the output terminal thereof.

The capacitor Cst is connected between the control terminal and the input terminal of the driving transistor Qd. The capacitor Cst stores a data voltage applied to the control terminal of the driving transistor Qd and maintains the data voltage even after the switching transistor Qs is turned off.

The organic light emitting element LD, which may be an organic light emitting diode in one example, has an anode connected to the output terminal of the driving transistor Qd and a cathode connected to a common voltage Vss. The organic light emitting element LD emits light having an intensity depending on an output current ILD of the driving transistor Qd, thereby displaying images.

The switching transistor Qs and the driving transistor Qd are n-channel field effect transistors (FETs), however at least one thereof may be a p-channel FET. In addition, the connection relationships of the transistors Qs and Qd, the capacitor Cst, and the organic light emitting diode LD may be modified.

Next, a pixel arrangement of the organic light emitting device shown in FIG. 1 will be described with reference to FIG. 2.

Figure 2:
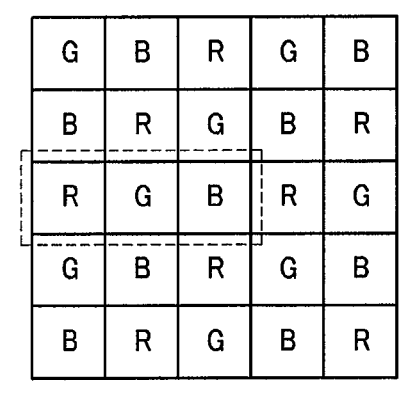

FIG. 2 is a top plan view showing an arrangement of a plurality of pixels in an organic light emitting device according to an embodiment of the present invention.

Referring to FIG. 2, an organic light emitting device according to an embodiment of the present invention includes red pixels R for displaying a red color, green pixels G for displaying a green color, and blue pixels B for displaying a blue color, which are alternately disposed. The red pixel R, the green pixel G, and the blue pixel B are primary pixels for displaying full colors. However, three pixels for displaying other three primary colors different from red, green, and blue may be included to replace the three primary color pixels of red, green, and blue. According to another embodiment of the present invention, an organic light emitting device may further include white pixels W not representing any specific color to improve the luminance besides the red pixels R, the green pixels G, and the blue pixels B.

Three pixels of a red pixel R, a green pixel G, and a blue pixel B form one group, and the group may be repeatedly arranged along the rows or columns in one example. However, the arrangement and the shape of the pixels may be variously changed.

Next, a detailed structure of an organic light emitting device shown in FIG. 1 and FIG. 2 according to an embodiment of the present invention will be described with reference to FIG. 3A.

Figure 3A:
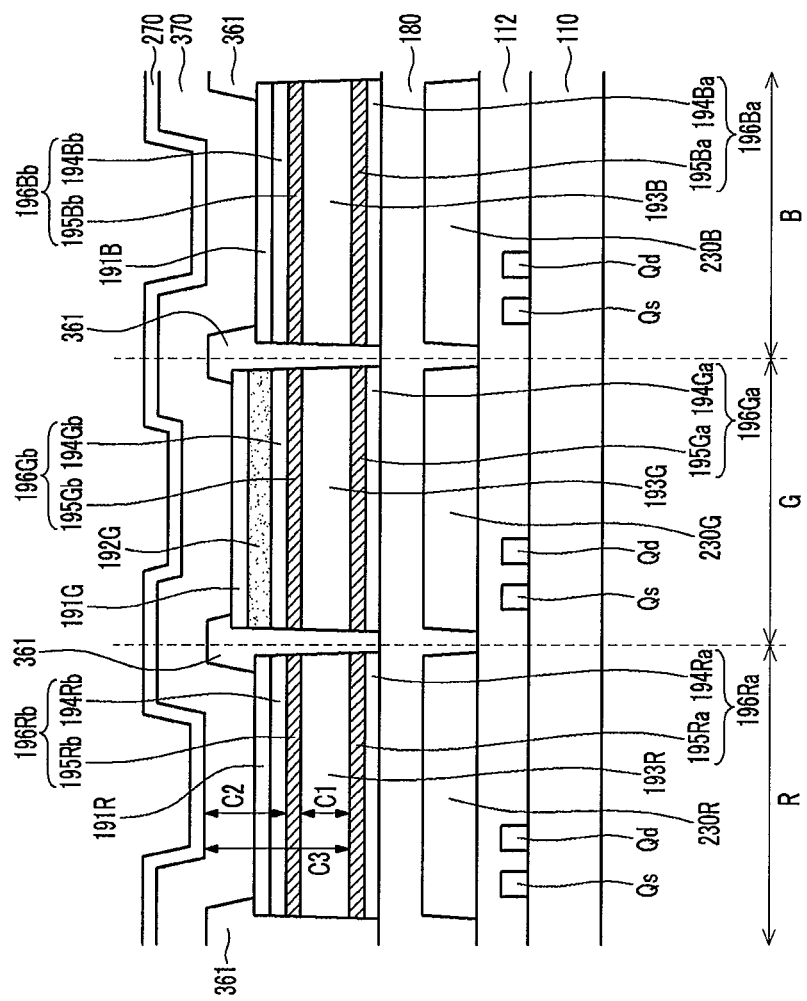
FIG. 3A is a cross-sectional view of an organic light emitting device according to an embodiment of the present invention.

FIG. 3A is a cross-sectional view of an organic light emitting device according to an embodiment of the present invention.

First, referring to FIG. 3A, a thin film transistor array including a plurality of switching transistors Qs and a plurality of driving transistors Qd is disposed on an insulation substrate 110 that may be made of transparent glass or plastic. Although not shown, the switching transistors Qs and the driving transistors Qd are electrically coupled to each other. A description of the switching transistors Qs and the driving transistors Qd that were described above is omitted here to avoid repetition.

An insulating layer 112 is disposed on the thin film transistor array including the switching transistors Qs and the driving transistors Qd. Further, red color filters 230R, green color filters 230G, and blue color filters 230B are respectively disposed at the red pixels R, green pixels G, and blue pixels B.

An overcoat 180 is disposed on the color filters 230R, 230G, and 230B and the insulating layer 112. The overcoat 180 may be made of an organic material and may have a flat surface.

Lower translucent members 196Ra, 196Ga, and 196Ba, intermediate members 193R, 193G, and 193B, and upper translucent members 196Rb, 196Gb, and 196Bb are sequentially and respectively disposed on the overcoat 180 and respectively above the respective color filters 230R, 230G, and 230B.

The lower translucent members 196Ra, 196Ga, and 196Ba respectively include lower oxide conductive members 194Ra, 194Ga, and 194Ba that may be made of a metal oxide and lower translucent metal members 195Ra, 195Ga, and 195Ba that may be made of a metal. Also, the upper translucent members 196Rb, 196Gb, and 196Bb respectively include upper oxide conductive members 194Rb, 194Gb, and 194Bb and upper translucent metal members 195Rb, 195Gb, and 195Bb.

The translucent metal members 195Ra, 195Ga, 195Ba, 195Rb, 195Gb, and 195Bb may be made of a metal having high reflectance such as silver (Ag) or aluminum (Al), and the thickness thereof may be in the range of about 50-200 Å. Even when a metal is used, if the thickness of the metal layer is thin enough, the metal layer has translucent characteristics to reflect or pass (transmit) incident light.

The lower oxide conductive members 194Ra, 194Ga, and 194Ba are disposed between the lower translucent metal members 195Ra, 195Ga, and 195Ba, and the overcoat 180. The upper oxide conductive members 194Rb, 194Gb, and 194Bb may contact the upper translucent metal members 195Rb, 195Gb, and 195Bb. The oxide conductive members 194Ra, 194Ga, 194Ba, 194Rb, 194Gb, 194Bb may be made of indium tin oxide (ITO) or indium zinc oxide (IZO). The oxide conductive members 194Ra, 194Ga, 194Ba, 194Rb, 194Gb, and 194Bb improve cohesion of the translucent metal members 195Ra, 195Ga, 195Ba, 195Rb, 195Gb, and 195Bb with other layers and prevent corrosion thereof. Particularly, the lower oxide conductive members 194Ra, 194Ga, and 194Ba may protect the lower translucent metal members 195Ra, 195Ga, and 195Ba from oxygen or moisture emitted from the overcoat 180 that may be made of an organic material. However, the upper oxide conductive members 194Rb, 194Gb, and 194Bb may be omitted.

The intermediate members 193R, 193G, and 193B are disposed between the lower and upper translucent members 196Ra, 196Ga, 196Ba, 196Rb, 196Gb, and 196Bb, and may be made of ITO or IZO. The intermediate members 193R, 193G, and 193B have a predetermined thickness, and may improve the cohesion of the translucent metal members 195Ra, 195Ga, 195Ba, 195Rb, 195Gb, and 195Bb, and may prevent possible corrosion thereof.

A transparent member 192G is disposed on the upper translucent member 196Gb of the green pixel G. The transparent member 192G may be made of ITO or IZO, or an inorganic material such as silicon oxide (SiOx) or silicon nitride (SiNx).

Alternatively, the positions of the transparent member 192G and the upper oxide conductive member 194Gb of the green pixel G may be exchanged.

Pixel electrodes 191R, 191B, and 191G are respectively disposed on the upper translucent members 196Rb and 196Bb of the red and blue pixels R and B and the transparent member 192G of the green pixel G. The pixel electrodes 191R, 191G, and 191B are connected to the driving transistors Qd. When the lower translucent members 196Ra, 196Ga, and 196Ba, the intermediate members 193R, 193G, and 193B, or the upper translucent members 196Rb, 196Gb, 196Bb are made of a conductive material, the pixel electrodes 191R, 191G, and 191B may be electrically connected to the driving transistor Qd via the members. The pixel electrodes 191R, 191G, and 191B may be made of a transparent conductive material such as ITO or IZO.

A plurality of insulation members 361 for insulation between the pixel electrodes 191R, 191B, and 191G are disposed between neighboring pixel electrodes 191R, 191G, and 191B on the overcoat 180. The insulation members 361 may be omitted.

A white organic light emitting member 370 is disposed on the insulation members 361 and the pixel electrodes 191R, 191G, and 191BG, and a common electrode 270 for transmitting a common voltage Vss is disposed on the white organic light emitting member 370.

The white organic light emitting member 370 may have a stacked structure of a plurality of organic material layers emitting different primary colors. The common electrode 270 may be made of a reflective metal such as calcium (Ca), barium (Ba), aluminum (Al), magnesium (Mg), aluminum (Al), or silver (Ag).

Alternatively, organic light emitting members (not shown) for uniquely emitting light of red, green, and blue may be respectively disposed in the red, green, and blue pixels R, G, and B. In this case, the red, green, and blue color filters 230R, 230G, and 230B may be omitted.

In such an organic light emitting device, the pixel electrode 191R, 191G, and 191B, the organic light emitting member 370, and the common electrode 270 form an organic light emitting element LD wherein the pixel electrode 191R, 191G, and 191B functions as an anode, and the common electrode 270 functions as a cathode.

The organic light emitting device emits light toward the direction of the substrate 110 to display an image. Light emitted at the organic light emitting member 370 and proceeding toward the substrate 110 passes the pixel electrode 191R, 191G, and 191B, the transparent member 192G (only for the green pixel G), and the upper oxide conductive member 194Rb, 194Gb, and 194Bb and reaches the upper translucent metal member 195Rb, 195Gb, and 195Bb, and then, the light is reflected toward the common electrode 270 or passes through the upper translucent metal member 195Rb, 195Gb, and 195Bb.

The light reflected in the direction of the common electrode 270 is again reflected at the common electrode 270, and reaches the upper translucent metal member 195Rb, 195Gb, and 195Bb. On the other hand, the light having passed through the upper translucent metal member 195Rb, 195Gb, and 195Bb passes through the intermediate member 193R, 193G, and 193B, arrives at the lower translucent metal member 195Ra, 195Ga, and 195Ba, and is reflected toward the upper translucent metal member 195Rb, 195Gb, and 195Bb or passes through the lower translucent metal member 195Ra, 195Ga, and 195Ba. The light reflected toward the upper translucent metal member 195Rb, 195Gb, and 195Bb is again reflected at the upper translucent metal member 195Rb, 195Gb, and 195Bb or passes through it.

In this way, light reciprocates between the upper translucent metal member 195Rb, 195Gb, and 195Bb and the common electrode 270 (which corresponds to the cavity C2), between the lower translucent metal member 195Ra, 195Ga, and 195Ba and the upper translucent metal member 195Rb, 195Gb, and 195Bb (which corresponds to the cavity C1), or between the lower translucent metal member 195Ra, 195Ga, and 195Ba and the common electrode 270 (which corresponds to the cavity C3), and is subjected to an optical process such as interference, and passes through the color filter 230R, 230G, and 230B when appropriate conditions are satisfied.

Here, the light path length of the cavity C1 between the lower translucent metal member 195Ra, 195Ga, and 195Ba and the upper translucent metal member 195Rb, 195Gb, and 195Bb, depends on the thickness and refractive index of the intermediate member 193R, 193G, and 193B. Accordingly, constructive interference may be generated in the desired wavelength range for all the primary colors of red, green, and blue by appropriately controlling the thickness and the refractive index of the intermediate member 193R, 193G, and 193B, thereby obtaining high color purity for respective primary colors.

Likewise, the thicknesses and refractive indexes of the thin films disposed in the cavity C2 between the upper translucent metal member 195Rb, 195Gb, and 195Bb and the common electrode 270, as well as the transparent member 192G of the green pixel G, may be appropriately determined so that a desired range of wavelength and high color purity for each of the primary colors including the green may be obtained.

In this way, if light of the desired wavelength undergoes constructive interference in the cavity C2 between the upper translucent metal member 195Rb, 195Gb, and 195Bb and the common electrode 270, and in the cavity C1 between the lower translucent metal member 195Ra, 195Ga, and 195Ba and the upper translucent metal member 195Rb, 195Gb, and 195Bb, then light reciprocating in the cavity C3 between the lower translucent metal member 195Ra, 195Ga, and 195Ba and the common electrode 270 may undergo constructive interference, and as a result, color reproducibility may be further improved.

The present embodiment includes two translucent members 196Ra, 196Ga, 196Ba, 196Rb, 196Gb, and 196Bb that partially reflect light for each pixel R, G, and B. However three or more translucent members for each pixel R, G, and B may be included, and the more the translucent members are included, the luminance and color purity of light in the desired wavelength range may be further increased. For example, when the number of translucent member is n, light may reciprocate in cavities of n(n+1)/2 number and undergoes constructive interference.

According to another embodiment of the present invention, at least one of the above-described lower and upper translucent members 196Ra, 196Ga, 196Ba, 196Rb, 196Gb, and 196Bb may comprise an inorganic layer (not shown) made of silicon oxide (SiOx) or silicon nitride (SiNx) in replacement of the translucent metal members 195Ra, 195Ga, 195Ba, 195Rb, 195Gb, and 195Bb. Since the refractive index of silicon oxide or silicon nitride is less than the refractive index if ITO or IZO, light that have passed through the oxide conductive member 194Rb, 194Gb, and 194Bb or the intermediate member 193R, 193G, and 193B that is disposed on the inorganic layer (not shown) and reaches the inorganic layer (not shown) is partially reflected at the boundary of the inorganic layer and the oxide conductive member 194Rb, 194Gb and 194Bb or the intermediate member 193R, 193G and 193B. The reflected light is subjected to the above-described optical process such as constructive interference thereby obtaining a desired range of wavelength and color purity. Alternatively, the inorganic layer (not shown) may have a multilayered structure including silicon nitride and silicon oxide alternately disposed, and light may be partially reflected at the boundaries between the multilayers.

Alternatively, at least one of the lower and upper translucent members 196Ra, 196Ga, 196Ba, 196Rb, 196Gb, and 196Bb may comprise multilayers (not shown) including an inorganic layer (not shown) of silicon oxide (SiOx) or silicon nitride (SiNx), and an oxide conductive layer of ITO or IZO in replacement of the translucent metal members 195Ra, 195Ga, 195Ba, 195Rb, 195Gb, and 195Bb. In this case, light may be reflected at the boundary between the layer of silicon oxide or silicon nitride and the layer of ITO or IZO that have a large difference in their refractive indexes, and may be subject to an optical process such as constructive interference, as described above.

When the lower translucent member 196Ra, 196Ga and 196Ba includes an inorganic layer (not shown) instead of translucent metal member 195Ra, 195Ga, and 195Ba, the lower oxide conductive member 194Ra, 194Ga, and 194Ba may be omitted, and the intermediate members 193R, 193G, and 193B may be made of silicon oxide or silicon nitride.

Next, a manufacturing method of the organic light emitting device shown in FIG. 3A will be described with reference to FIG. 3B to FIG. 3G.

FIG. 3B to FIG. 3G are cross-sectional views of the organic light emitting device shown in FIG. 3A in intermediate steps of a manufacturing method of an organic light emitting device according to an embodiment of the present invention.

Figure 3B:
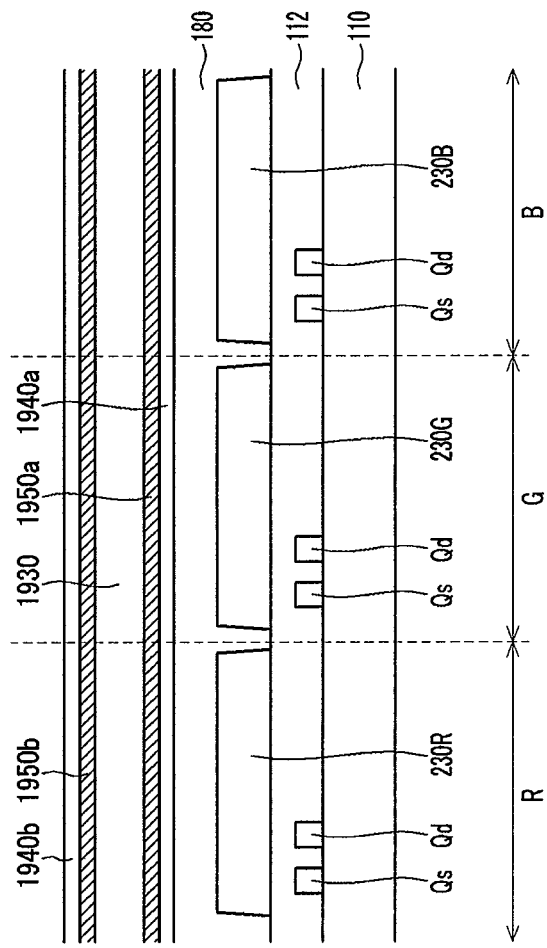
FIG. 3B to FIG. 3G are cross-sectional views of the organic light emitting device shown in FIG. 3A in intermediate steps of a manufacturing method of an organic light emitting device according to an embodiment of the present invention.

First, referring to FIG. 3B, a thin film transistor array is formed on an insulation substrate 110, and an insulating layer 112, a plurality of color filters 230R, 230G, and 230B, and an overcoat 180 are sequentially formed thereon.

Next, a lower oxide conductive member layer 1940a, a lower translucent metal member layer 1950a, an intermediate member layer 1930, an upper translucent metal member layer 1950b, and an upper oxide conductive member layer 1940b are sequentially deposited on the overcoat 180.

Figure 3C:
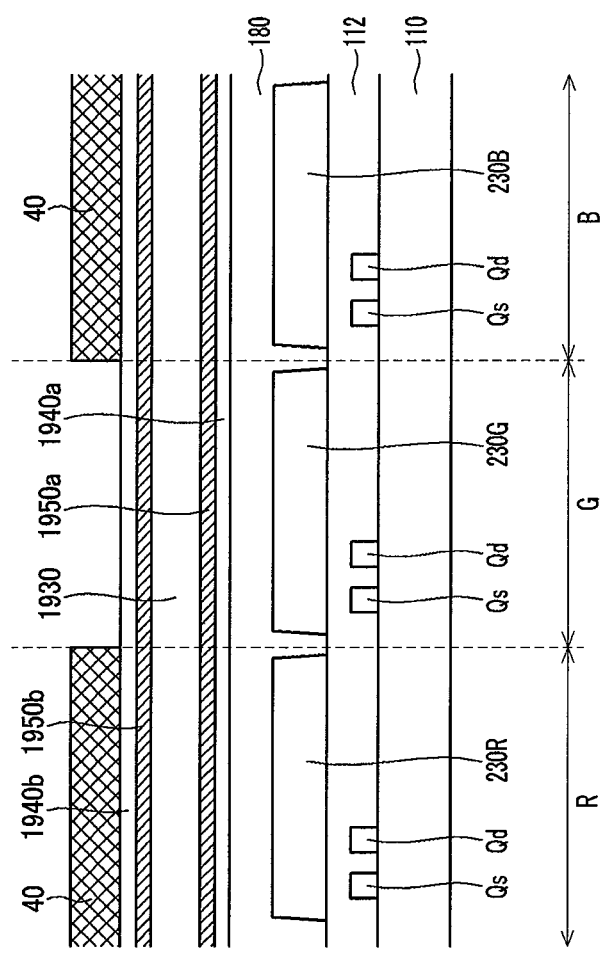

Next, as shown in FIG. 3C, a first photosensitive film (not shown) is coated on the upper oxide conductive member layer 1940b, and patterned to form a first photosensitive pattern 40.

Figure 3D:
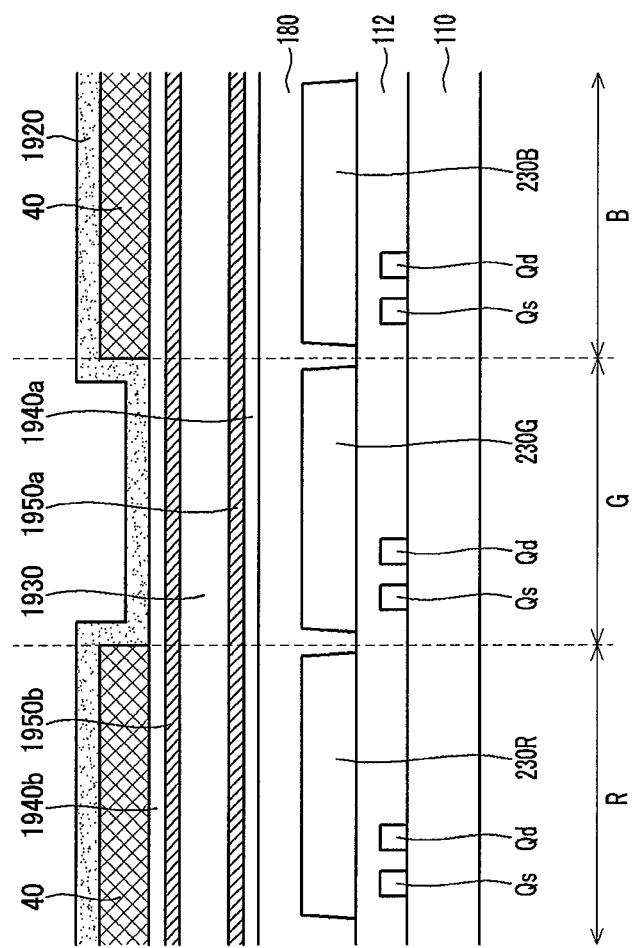

Referring to FIG. 3D, a transparent member layer 1920 is deposited on the first photosensitive pattern 40 and the upper oxide conductive member layer 1940b.

Figure 3E:
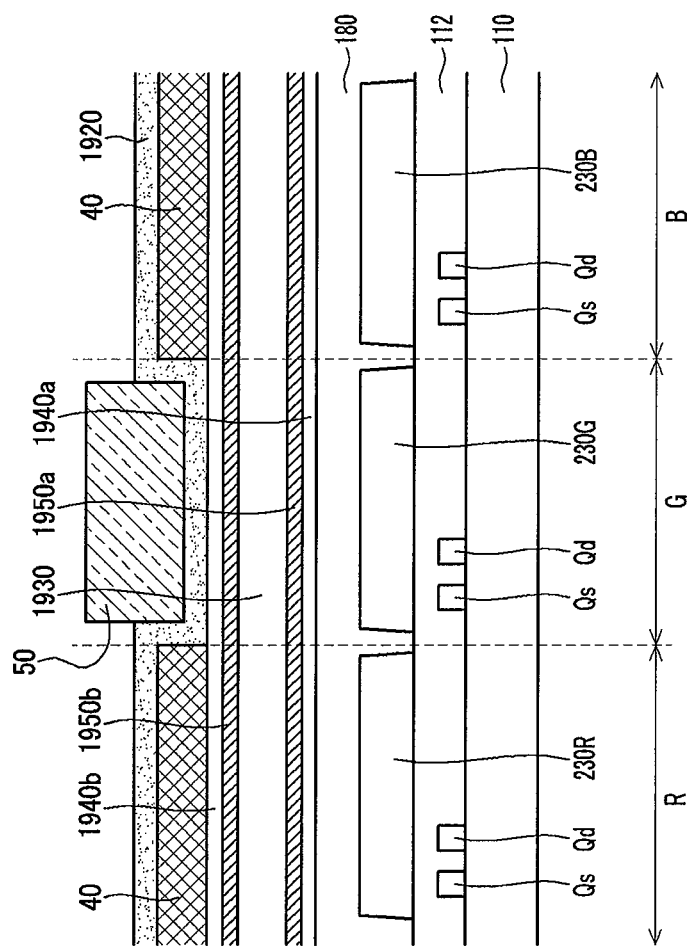

Referring to FIG. 3E, a second photosensitive film (not shown) is coated on the transparent member layer 1920, and patterned to form a second photosensitive pattern 50. The second photosensitive pattern 50 may remain on the green pixel G.

Figure 3F:
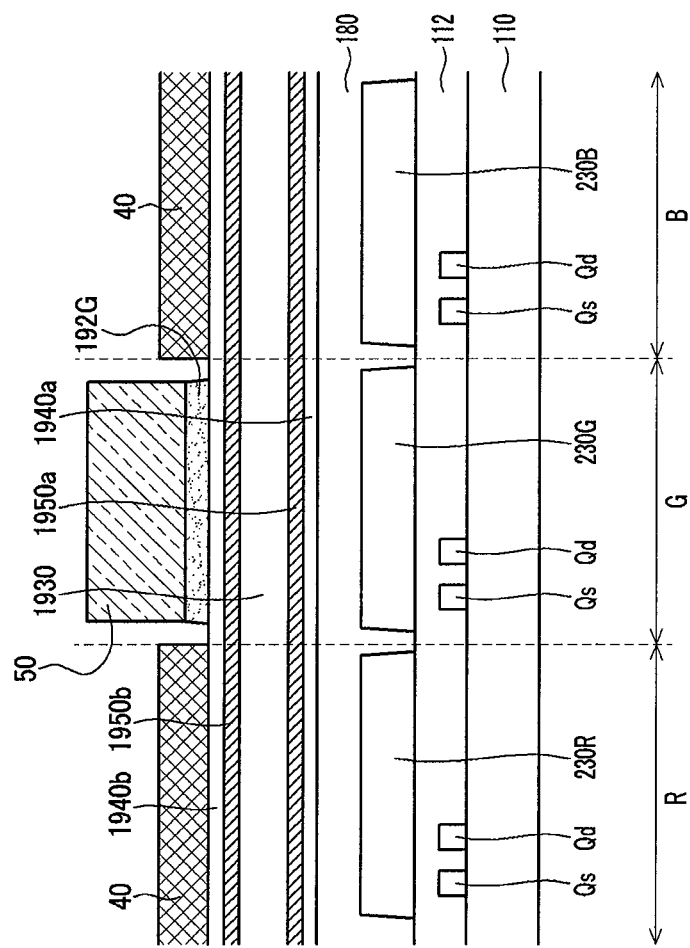

Next, referring to FIG. 3F, the transparent member layer 1920 is etched using the second photosensitive pattern 50 as a mask to form a transparent member 192G of the green pixel G.

Figure 3G:
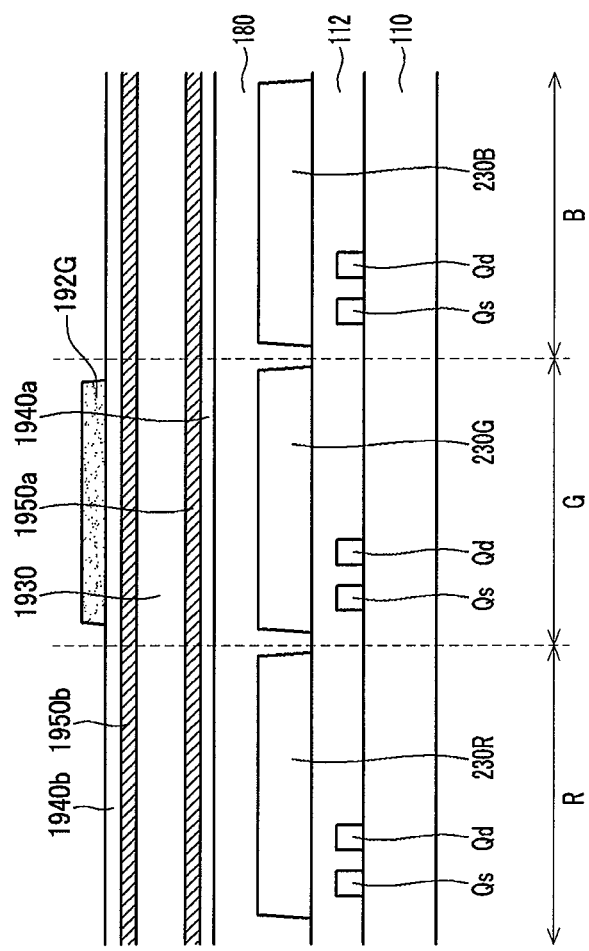

Next, referring to FIG. 3G, the first and second photosensitive patterns 40 and 50 are removed.

Next, as shown in FIG. 3A, ITO or IZO is deposited on the upper oxide conductive member layer 1940b, and patterned by photolithography to form lower translucent members 196Ra, 196Ga, 196Ba, intermediate members 193R, 193G, and 193B, upper translucent members 196Rb, 196Gb, 196Bb, and a plurality of pixel electrodes 191R, 191G, and 191B. Then, a plurality of insulation members 361, an organic light emitting member 370, and a common electrode 270 are sequentially formed thereon.

An organic light emitting device according to another embodiment of the present invention will now be described with reference to FIG. 4.

FIG. 4 is a cross-sectional view of an organic light emitting device according to an embodiment of the present invention.

In the present embodiment, descriptions of the same elements as the previous embodiment will be omitted, and the same reference numerals indicates the same constituent elements.

A thin film transistor array, an insulating layer 112, a plurality of color filters 230R, 230G, and 230B, an overcoat 180, lower translucent members 196Ra, 196Ga, 196Ba including lower translucent metal members 195Ra, 195Ga, and 195Ba, intermediate members 193R, 193G, and 193B, upper translucent members 196Rb, 196Gb, and 196Bb including upper translucent metal members 195Rb, 195Gb, and 195Bb, transparent members 192R and 192B (excepting the green pixel G), pixel electrodes 191R, 191G, and 191B, insulation members 361, an organic light emitting member 370, and a common electrode 270 are sequentially disposed on an insulation substrate 110.

According to the present embodiment, a transparent member does not exist in a green pixel G, unlike the previous embodiment. Instead, transparent members 192R and 192B are respectively disposed on the upper translucent members 196Rb and 196Bb of the red and blue pixels R and B.

Similar to the previous embodiment, the light path length between the lower translucent metal member 195Ra, 195Ga, and 195Ba and the upper translucent metal member 195Rb, 195Gb, and 195Bb (which corresponds to cavity C1) may be by appropriately selected so that light of the wavelengths corresponding to red, green, and blue may have high luminance through constructive interference. Also, the light path length between the upper translucent metal member 196Rb, 196Gb, and 196Bb and the common electrode 270 (which corresponds to cavity C2) may be selected differently for the red and blue pixels R and B from the green pixel G, such that light of the respective wavelengths corresponding to respective colors may undergo constructive interference. In this way, the optical condition for the green pixel G may be separately selected from the red and blue pixels R and B, and accordingly, thickness of thin films may be reduced and the optical efficiency may be increased.

Next, an organic light emitting device according to another embodiment of the present invention will be described with reference to FIG. 5.

Figure 5:
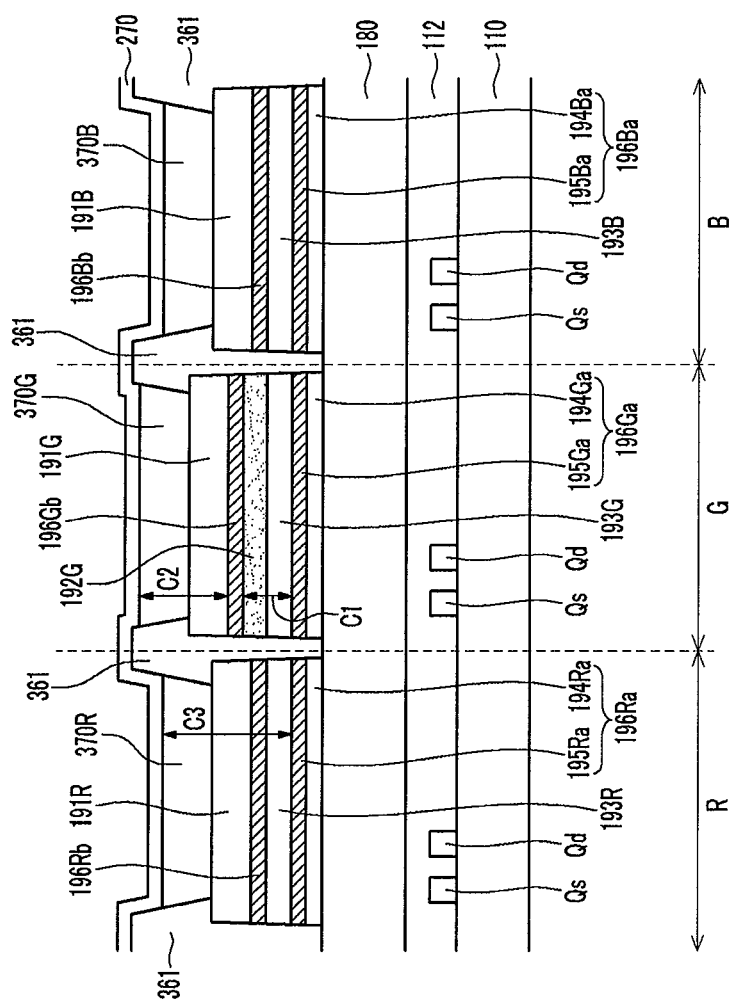

FIG. 5 is a cross-sectional view of an organic light emitting device according to an embodiment of the present invention.

In the present embodiment, descriptions of the same elements will be omitted, and the same constituent elements as in the above-described embodiment are indicated by the same reference numerals.

A thin film transistor array, an insulating layer 112, an overcoat 180, lower translucent members 196Ra, 196Ga, and 196Ba, intermediate members 193R, 193G, and 193B, transparent members 192G (only for a green pixel G), upper translucent members 196Rb, 196Gb, and 196Bb, pixel electrodes 191R, 191G, and 191B, insulation members 361, organic light emitting members 370R, 370G, and 370B, and a common electrode 270 are sequentially disposed on an insulation substrate 110.

The organic light emitting device according to the present embodiment has almost the same structure as the organic light emitting device shown in FIG. 3A.

The upper translucent members 196Rb, 196Gb, and 196Bb may include translucent metal members (not shown) made of silver or aluminum, and oxide conductive members (not shown) disposed on or under the translucent metal members (not shown) and made of ITO or IZO like the organic light emitting device of FIG. 3A. However, the organic light emitting device according to the present embodiment does not include any color filter, and an overcoat 180 as in the organic light emitting device of FIG. 3A may be omitted. Also, instead of the white organic light emitting member as in FIG. 3A, red, green, and blue organic light emitting members 370R, 370G, and 370B are respectively disposed at the red, green, and blue pixels R, G, and B in the openings enclosed by the insulation members 361. Each of the red, green, and blue organic light emitting members 370R, 370G, and 370B may be made of an organic material uniquely emitting light of red, green, or blue. Thus, color purity of respective primary colors may be further improved. In this case, the color filters 230R, 230G, and 230B may be omitted.

According to the present embodiment, compared to the embodiment shown in FIG. 3A, the transparent member 192G of the green pixel G exists between the intermediate member 193G and the upper translucent member 196Gb.

In this way, by providing a transparent member 192G in the green pixel G, light path lengths between the lower translucent members 196Ra, 196Ga, and 196Ba and the upper translucent members 196Rb, 196Gb, and 196Bb (which corresponds to C1) may be selected for the green pixel G separately from the red and blue pixels R and B, and then light of the respective wavelengths corresponding to respective colors may undergo constructive interference, reciprocating at the cavity C1.

Also, the light path length between the upper translucent members 196Rb, 196Gb, and 196Bb and the common electrode 270 (which corresponds to cavity C2) in the respective pixels R, G, and B may be determined by appropriately selecting the thickness and index of the pixel electrodes 191R, 191G, and 191B and the organic light emitting members 370R, 370G, and 370B so that constructive interference may be generated for desired range of wavelengths of all primary colors R, G, and B. In the present embodiment, since organic light emitting members 370R, 370G, and 370B are disposed between the upper translucent member 196Rb, 196Gb, and 196Bb and the common electrode 270 (which corresponds to cavity C2), the thickness of the organic light emitting members 370R, 370G and 370B may be considered as the light path length so that the pixel electrodes 191R, 191G, and 191B need not be thick.

Also, light which reciprocates and is repeatedly reflected between the lower translucent metal members 195Ra, 195Ga and 195Ba and the common electrode 270 (which corresponds to cavity C3) also undergoes constructive interference, thereby improving color reproducibility.

Finally, an organic light emitting device according to another embodiment of the present invention will be described with reference to FIG. 6.

Figure 6:
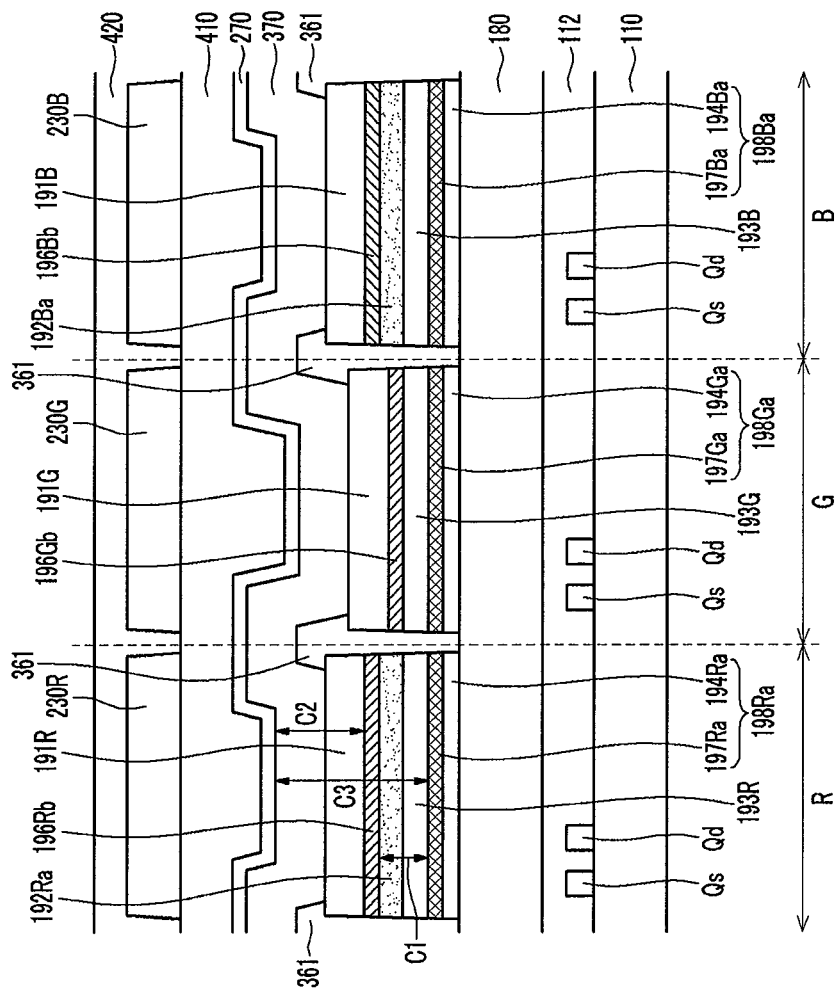

FIG. 6 is a cross-sectional view of an organic light emitting device according to an embodiment of the present invention.

In the present embodiment, descriptions of the same elements will be omitted, and the same constituent elements as in the above-described embodiment are indicated by the same reference numerals.

A thin film transistor array, an insulating layer 112, an overcoat 180, reflective members 198Ra, 198Ga, and 198Ba, intermediate members 193R, 193G, and 193B, transparent members 192Ra and 192Ba (except for the green pixel G), upper translucent members 196Rb, 196Gb, and 196Bb, pixel electrodes 191R, 191G, and 191B, insulation members 361, an organic light emitting member 370, a common electrode 270, a lower overcoat 410, color filters 230R, 230G, and 230B, and an upper overcoat 420 are sequentially disposed in an insulation substrate 110.

The reflective members 198Ra, 198Ga, and 198Ba may include oxide conductive members 194Ra, 194Ga, and 194Ba and reflective metal members 197Ra, 197Ga, and 197Ba made of a metal. The reflective metal members 197Ra, 197Ga, and 197Ba may be made of an opaque conductive material such as aluminum (Al) or an aluminum alloy, silver (Ag) or a silver alloy, or a metal having a high work function such as Au, Pt, Ni, Cu, W, or alloys thereof.

The common electrode 270 may be made of a metal comprising calcium (Ca), barium (Ba), magnesium (Mg), aluminum (Al), or silver (Ag).

The upper translucent members 196Rb, 196Gb, and 196Bb may include a translucent metal member (not shown) including silver or aluminum and an oxide conductive member (not shown) disposed above or below the translucent metal member (not shown) and made of ITO or IZO, like the organic light emitting device of FIG. 5.

Different from the organic light emitting device shown in FIG. 5, the organic light emitting device according to the present embodiment includes a white organic light emitting member 370 disposed on the whole surface thereof.

Different from the organic light emitting device shown in FIG. 5, the transparent members 192Ra and 192Ba are respectively disposed between the intermediate members 193R and 193B of the red and blue pixels R and B and the upper translucent members 196Rb and 196Bb.

Also, the color filters 230R, 230G, and 230B are disposed on the common electrode 270. The lower and upper overcoats 410 and 420 may be made of an (organic) insulating material.

The organic light emitting device display emits light upward away from the substrate 110 to display an image. Light emitted from the organic light emitting member 370 toward the substrate 110 reciprocates between the reflective metal members 197Ra, 197Ga, and 197Ba and the upper translucent members 196Rb, 196Gb, and 196Bb (which corresponds to cavity C1), between the upper translucent members 196Rb, 196Gb, and 196Bb and the common electrode 270 (which corresponds to cavity C2), and between the reflective metal members 197Ra, 197Ga, and 197Ba and the common electrode 270 (which corresponds to cavity C3), being subjected to an optical process such as constructive interference. Then, the light passes through the color filters 230R, 230G, and 230B and goes outside when appropriate conditions are satisfied.

Here, by providing transparent members 192Ra and 192Ba in the red and blue pixels R and B, the light path length between the reflective metal members 197Ra, 197Ga, and 197Ba and the upper translucent members 196Rb, 196Gb, and 196Bb (which corresponds to cavity C1) may be selected appropriately for the red and blue pixels R and B separately from the green pixel G.

Even though the embodiments shown in FIG. 3A, FIG. 4, FIG. 5, and FIG. 6 do not include a white pixel for displaying white, white pixels including white color filters may be further included. The present invention may be applied to an organic light emitting device having a different structure from the described embodiments of the present invention.

Even though the transparent members 192R, 192G, 192B, and 192Ra are used to vary the light path length of the red and blue pixels R and B, and the green pixel G in an embodiment of the present invention, instead of the transparent members 192R, 192G, 192B, and 192Ra, protrusions and depressions (not shown) may be formed on the surface of the overcoat 180 of the green pixel G, or protrusions and depressions (not shown) may be formed on the surface of the overcoat 180 of the red and blue pixels R and B. Then, the light path length may be controlled or light may be scattered by the protrusions and depressions so that color change according to viewing angles may be prevented.

According to an embodiment of the present invention, color reproducibility of an organic light emitting device may be improved, and the light efficiency may be increased.

While this invention has been described in connection with what is presently considered to be practical embodiments, it is to be understood that the invention is not limited to the disclosed embodiments, but, on the contrary, is intended to cover various modifications and equivalent arrangements included within the spirit and scope of the appended claims.

What is claimed is:

1. An organic light emitting device, comprising: a substrate; a first pixel displaying a first color on the substrate; a second pixel displaying a second color on the substrate; a third pixel displaying a third color on the substrate; and an organic light emitting member formed on the first, second, and third pixel, and a common electrode disposed on the organic light emitting member and formed of a reflective material,
wherein each of the first, second, and third pixels comprises:
a first translucent member,
a second translucent member disposed on the first translucent member,
an intermediate member disposed between the first and second translucent members,
a pixel electrode disposed on the second translucent member, and
wherein the organic light emitting member is disposed on the pixel electrode,
wherein the second pixel further comprises a second transparent between the second translucent member and the pixel electrode;
the third pixel further comprises a third transparent member between the second translucent member and the pixel electrode; and
a thickness of the second transparent member is the same as a thickness of the third transparent member,
wherein the first translucent member and the second translucent member of the first pixel each includes a translucent metal layer in contact with the intermediate layer, and
the second translucent member includes an oxide conductive layer disposed on and in contact with the translucent metal layer opposite the intermediate layer,
wherein the pixel electrode is disposed on the oxide conductive layer,
wherein light from the organic light emitting member is reflected at the common electrode through the first and second translucent members and exits the organic light emitting device through the substrate.

2. The organic light emitting device of claim 1, wherein the second pixel is a red pixel and the third pixel is a blue pixel.

3. The organic light emitting device of claim 1, wherein the second and third transparent members comprise at least one of indium tin oxide, indium zinc oxide, silicon oxide, and silicon nitride.

4. The organic light emitting device of claim 1, further comprising
an overcoat disposed under the first translucent members of the first, second, and third pixels.

5. The organic light emitting device of claim 4, wherein at least one of the first, second, and third pixels comprises protrusions and depressions formed on a surface of the overcoat.

6. The organic light emitting device of claim 1, wherein the translucent metal member comprises at least one of silver and aluminum.

7. The organic light emitting device of claim 6, wherein a thickness of the translucent metal member is in a range of about 50 Å to about 200 Å.

8. The organic light emitting device of claim 6, wherein the intermediate member comprises indium tin oxide or indium zinc oxide.

9. The organic light emitting device of claim 1, wherein the oxide conductive member comprises indium tin oxide or indium zinc oxide.

10. The organic light emitting device of claim 1, wherein at least one of the first translucent member and the second translucent member comprises a first thin film and a second thin film.

11. The organic light emitting device of claim 10, wherein the first thin film comprises silicon oxide, and the second thin film comprises silicon nitride.

12. The organic light emitting device of claim 10, wherein the first thin film comprises indium tin oxide or indium zinc oxide, and the second thin film comprises silicon oxide or silicon nitride.

13. The organic light emitting device of claim 1, wherein the organic light emitting members formed on the first, second, and third pixel are white organic light emitting members and are connected to each other.

14. The organic light emitting device of claim 13, wherein the first, second, and third pixels further respectively comprise a first color filter, a second color filter, and a third color filter disposed under the respective first translucent members.

15. The organic light emitting device of claim 1, wherein the organic light emitting members formed on the first, second, and third pixel respectively represent different colors.

16. The organic light emitting device of claim 15, wherein the first, second, and third pixels respectively comprise a first color filter, a second color filter, and a third color filter disposed under the respective first translucent members.

17. The organic light emitting device of claim 1, wherein the translucent metal member comprises a reflective metal member comprising Al, Ag, Au, Pt, Ni, Cu, W, or alloys thereof.

18. The organic light emitting device of claim 17, wherein the first, second, and third pixels further respectively comprise first, second, and third color filters disposed on the respective pixel electrodes.

19. An organic light emitting device, comprising: a substrate; a first pixel displaying a first color on the substrate; a second pixel displaying a second color on the substrate; a third pixel displaying a third color on the substrate;
an organic light emitting member formed on the first, second, and third pixel, and a common electrode disposed on the organic light emitting member and formed of a reflective material,
wherein each of the first, second, and third pixels comprises:
a first translucent member,
a second translucent member disposed on the first translucent member,
an intermediate member disposed between the first and second translucent members,
a pixel electrode disposed on the second translucent member, and
wherein the organic light emitting member is disposed on the pixel electrode, and
the first pixel further comprises a first transparent member between the second translucent member and the pixel electrode,
wherein the first translucent member and the second translucent member of at least one of the second pixel and third pixel each include a translucent metal layer in contact with the intermediate layer, and the second translucent member includes an oxide conductive layer disposed on and in contact with the translucent metal layer opposite the intermediate layer,
wherein the pixel electrode is disposed on the oxide conductive layer,
wherein light from the organic light emitting member is reflected at the common electrode through the first and second translucent members and exits the organic light emitting device through the substrate.

20. The organic light emitting device of claim 19, wherein the first transparent member comprises at least one of indium tin oxide, indium zinc oxide, silicon oxide, and silicon nitride.

21. An method for manufacturing an organic light emitting device comprising a first pixel displaying a first color, a second pixel displaying a second color, a third pixel displaying a third color, the method comprising:
sequentially depositing a lower oxide conductive layer, a lower translucent metal layer, an intermediate layer, an upper translucent metal layer, and an upper oxide conductive layer on a substrate;
forming a transparent member on the upper oxide conductive member layer corresponding to at least one of the first pixel, the second pixel, and the third pixel;
depositing a pixel electrode material on the transparent member and the upper oxide conductive member layer;
forming a pixel electrode, an upper translucent member, an intermediate member, and a lower translucent member by patterning the pixel electrode material, the upper oxide conductive member layer, the upper translucent metal member layer, the intermediate member layer, the lower translucent metal member layer, and the lower oxide conductive member layer by photolithography;
forming an organic light emitting member on the pixel electrode; and
forming a common electrode on the organic light emitting member, the common electrode formed of a reflective material, wherein light from the organic light emitting member is reflected at the common electrode through the first and second translucent members and exits the organic light emitting device through the substrate,
wherein the forming of the transparent member comprises:
forming a first photosensitive pattern on the upper oxide conductive member layer corresponding to at least one of the first pixel, the second pixel, and the third pixel;
depositing a transparent member layer on the first photosensitive pattern and the upper oxide conductive member layer;
forming a second photosensitive pattern on the transparent member layer corresponding to at least one pixel where the first photosensitive pattern is not disposed among the first pixel, the second pixel, and the third pixel;
etching the transparent member layer using the second photosensitive pattern as an etching mask; and
removing the first and second photosensitive patterns.

22. The method of claim 21, wherein
the forming of the pixel electrode, the upper translucent member, the intermediate member, and the lower translucent member comprises using an etching mask.

23. The method of claim 21, wherein
the first photosensitive pattern comprises a photosensitive film disposed on the second and third pixels, and
the second photosensitive pattern comprises a photosensitive film disposed on the first pixel.

24. The method of claim 21, wherein
the lower and upper translucent metal member layers comprise silver or aluminum.

25. The method of claim 21, wherein
the lower and upper oxide conductive member layers comprise indium tin oxide or indium zinc oxide.

* * * * *